(12) United States Patent
Lallemand et al.

(10) Patent No.: US 12,107,118 B2
(45) Date of Patent: Oct. 1, 2024

(54) METHOD FOR FORMING AN ELECTRONIC PRODUCT COMPRISING TWO CAPACITORS HAVING DIFFERENT DIELECTRIC THICKNESSES, AND CORRESPONDING ELECTRONIC PRODUCT

(71) Applicant: Murata Manufacturing Co., Ltd., Nagaokakyo (JP)

(72) Inventors: Florent Lallemand, Herouville Saint-Clair (FR); Stéphane Bouvier, Cairon (FR)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 735 days.

(21) Appl. No.: 17/182,471

(22) Filed: Feb. 23, 2021

(65) Prior Publication Data

US 2021/0202692 A1    Jul. 1, 2021

Related U.S. Application Data

(63) Continuation of application No. PCT/IB2019/057139, filed on Aug. 26, 2019.

(30) Foreign Application Priority Data

Sep. 4, 2018 (EP) .................... 18306164

(51) Int. Cl.
*H01L 21/3065* (2006.01)
*H01L 21/311* (2006.01)
*H01L 49/02* (2006.01)

(52) U.S. Cl.
CPC .......... *H01L 28/91* (2013.01); *H01L 21/3065* (2013.01); *H01L 21/31111* (2013.01)

(58) Field of Classification Search
None
See application file for complete search history.

(56) References Cited

U.S. PATENT DOCUMENTS 8,283,750 B2    10/2012  Guiraud et al.
8,305,109 B2 *  11/2012  Okazaki .............. H01L 27/1233
                                                           326/113

(Continued)

OTHER PUBLICATIONS

International Search Report issued for PCT/IB2019/057139, date of mailing Feb. 6, 2020.

(Continued)

*Primary Examiner* — Michelle Mandala
(74) *Attorney, Agent, or Firm* — ArentFox Schiff LLP

(57) ABSTRACT

An electronic product having a first capacitor and a second capacitor, where the electronic product includes a semiconductor substrate having a bottom electrode region of the first capacitor and a bottom electrode region of the second capacitor; a first dielectric layer having a first thickness arranged above the bottom electrode region of the first capacitor; a second dielectric layer having a second thickness arranged above the bottom electrode region of the second capacitor, the first thickness and the second thickness being different; a top electrode region of the first capacitor arranged above the bottom electrode of the first capacitor and above the first dielectric layer; and a top electrode region of the second capacitor arranged above the bottom electrode of the second capacitor and above the second dielectric layer.

7 Claims, 9 Drawing Sheets

(56) References Cited

U.S. PATENT DOCUMENTS

| | | |
|---|---|---|
| 8,525,296 B1 | 9/2013 | Lin et al. |
| 2007/0215920 A1 | 9/2007 | Zundel et al. |
| 2009/0039411 A1 | 2/2009 | Anezaki |
| 2010/0230787 A1 | 9/2010 | Guiraud et al. |
| 2010/0297820 A1* | 11/2010 | Lee .................. H10B 53/00 257/E21.648 |

OTHER PUBLICATIONS

Written Opinion of the International Searching Authority issued for PCT/IB2019/057139, date of mailing Feb. 6, 2020.

* cited by examiner

METHOD FOR FORMING AN ELECTRONIC PRODUCT COMPRISING TWO CAPACITORS HAVING DIFFERENT DIELECTRIC THICKNESSES, AND CORRESPONDING ELECTRONIC PRODUCT

CROSS REFERENCE TO RELATED APPLICATIONS

The present application is a continuation of International application No. PCT/IB2019/057139, filed Aug. 26, 2019, which claims priority to European Patent Application No. 18 306 164.7, filed Sep. 4, 2018, the entire contents of each of which are incorporated herein by reference

FIELD OF THE INVENTION

The present invention relates to the field of integration and, more particularly, to electronic products, related semiconductor products, and their methods of manufacture.

The present invention more precisely relates to electronic components comprising capacitors.

TECHNICAL BACKGROUND

Electronic components such as capacitors may be integrated into semiconductor products in a variety of forms. For example, planar capacitors may be formed above semiconductor substrates by forming two planar electrodes separated by a dielectric layer. However planar capacitors provide low capacitance density, this implies that a high value capacitance will consume a significant area of silicon.

To overcome this issue, it has been proposed to form three-dimensional structures to increase the capacitance of a capacitor using the same surface area of the semiconductor substrates. Capacitance densities of the order of a Farad per $m^2$ have been achieved using three-dimensional capacitors. Fabrication of three-dimensional capacitors has been made possible through the introduction of manufacturing methods that form high aspect ratio structures such as Deep Reactive Ion Etching, better known under the acronym DRIE.

It has thus been proposed to form matrixes of various structures in a silicon structure such as blind holes or pillars, so as to form bottom electrodes of capacitors. Typically, a dielectric layer is deposited in a conformal manner in the holes or all over the pillars (i.e. above the bottom electrodes), and a top electrode is formed above the dielectric so as to form a capacitor.

It has been observed that in a capacitor having a bottom electrode comprising holes, the aspect ratio of the bottom electrode may reach 17. In a capacitor having a bottom electrode comprising pillars, the aspect ratio may reach 50. Various examples of holes and pillars are disclosed in document U.S. Pat. No. 8,283,750.

The above solutions focus increase of surface which is aimed at to increase the capacitance value of a capacitor.

To increase the capacitance value of a capacitor, it has also been proposed to use dielectric materials having a high dielectric constant (with respect to silicon dioxide).

Also, it has been proposed to implement capacitors on top of each other which are connected in parallel using the metal interconnections of the device comprising the capacitors to increase the capacitance value while using the same silicon surface area. Such devices may be called MIMIM (for Metal-Insulator-Metal-Insulator-Metal) by the person skilled in the art.

Finally, and as can be conceived by the person skilled in the art, it is possible to adjust the thickness of the dielectric layer of a capacitor. But adjusting this thickness has direct effect on the lifetime of a capacitor.

In fact, the lifetime of a capacitor having a given thickness can particularly be estimated as a function of time, usage temperature, and applied voltage.

It can be deduced from the above that the different parameters of a capacitor are selected for each application. It is also typically desirable that in a device comprising an array of capacitors, these capacitors exhibit the same breakdown voltage (and the same maximum admissible applied voltage for a given reliability target). This facilitates the fabrication of the capacitors as they are manufactured in a parallel manner.

In order to meet the demands of a user in terms of applied voltage, all the capacitors made on a same chip may be made with a dielectric thickness which will be able to withstand the highest applied voltage with a satisfying lifetime. This may reduce the capacitance per unit of surface of the devices, since some capacitors will be based on a dielectric that will be far too thick for the voltage they have to withstand.

Also, it has been observed that for some users, only a portion of the capacitor arranged on a semiconductor chip may be operated with a high voltage. It is thus desirable to provide a solution which increases the capacitance density while ensuring satisfying reliability.

The present invention has been made in the light of the above problems.

SUMMARY OF THE INVENTION

The present invention provides a method of forming at least a first capacitor and a second capacitor, the method comprising: forming, in a semi-conductor substrate, a bottom electrode region of the first capacitor and a bottom electrode region of the second capacitor; forming a first protective layer above the bottom electrode region of the second capacitor (this step leaves the bottom electrode region of the first capacitor exposed, i.e. the first protective layer does not extend above the bottom electrode region of the first capacitor); forming a first dielectric layer having a first thickness above the bottom electrode region of the first capacitor; forming a second protective layer above the first dielectric layer and above the bottom electrode region of the first capacitor (this step leaves the bottom electrode region of the second capacitor exposed, i.e. the first protective layer does not extend above the bottom electrode region of the first capacitor); removing the first protective layer to expose the bottom electrode region of the second capacitor; forming a second dielectric layer having a second thickness above the second electrode region of the second capacitor, the first thickness and the second thickness being different; removing the second protective layer; forming a top electrode region of the first capacitor above the bottom electrode of the first capacitor and above the first dielectric layer so as to form the first capacitor; and forming a top electrode region of the second capacitor above the bottom electrode of the second capacitor and above the second dielectric layer so as to form the second capacitor.

By using a protective layer above a bottom electrode region of a capacitor, it is possible to form a dielectric layer having a thickness which will be chosen for a specific capacitor, while the bottom electrode region which is covered by the protective layer may receive a dielectric layer having a different thickness.

Because the bottom electrodes are formed in a semi-conductor substrate, the two capacitors are also formed on the same semi-conductor substrate and, in fine, these capacitors having different dielectric thicknesses may be on a same chip.

It should be noted that in the present description, the adjectives bottom and top merely indicate the respective position of two electrodes and that the bottom electrode of a capacitor is the first electrode which is manufactured.

According to a particular embodiment, forming, in a semi-conductor substrate, the bottom electrode region of the first capacitor and/or the bottom electrode region of the second capacitor comprises forming at least one pillar or at least one blind hole in the semiconductor substrate.

It has been observed that it is possible to protect, with a protective layer, bottom electrodes which comprise one or more pillars or one or more holes or one or more trenches.

It should be noted that the above method allows obtaining more than two capacitors (for example N capacitors) each having a dielectric layer having a respective thickness.

In order to manufacture N different capacitors, the method may then comprise forming, in a semi-conductor substrate, a plurality of bottom electrode regions of a plurality of capacitors, and, for each capacitor of the plurality of capacitors, forming a dielectric layer having a specific thickness (for example specific to the capacitor) above the uncovered bottom electrode region of the capacitor while the other bottom electrode regions of the other capacitors are covered by at least one layer of protective material.

According to a particular embodiment, forming, in a semi-conductor substrate, the bottom electrode region of the first capacitor or the bottom electrode region of the second capacitor comprises a deep reactive ion etching step.

Thus, the invention is applicable in high aspect ratio structures. It should be noted that the aspect ratio is the ratio between the smallest width between two adjacent pillars (or the width of a hole, or the width of a trench), with the depth of material which has been etched (the depth of a blind hole, or the depth of a trench, or the height of a pillar).

According to a particular embodiment forming the first protective layer or forming the second protective layer comprises a non-conformal deposition step, for example a PECVD (Plasma-Enhanced Chemical Vapor Deposition) step.

It has been observed by the inventors that depositing a protective layer using, for example, PECVD, allows depositing a layer in a possibly non conformal manner which obstructs any blind hole or trench between pillars. A quick deposition of material may then prevent the deposition of dielectric in the areas covered by the protective layer.

It should be noted that PECVD is a technique that enables the deposition of thick films (1 µm range) with a high deposition rate at low temperature (<400° C.), especially with respect to other techniques such as LPCVD (Low Pressure Chemical Vapor Deposition) which provides lower deposition rates and requires high temperature processing.

It should be noted that traditionally, the poor-conformity of the films deposited using PECVD is seen as a drawback. However, in the present embodiment it is advantageous, it allows forming plugs which may not necessarily fill the structures (holes, trenches, pillars) and use less material/deposition time.

According to a particular embodiment, the protective layer (first or second) comprises silicon dioxide.

This material has been shown to allow fast deposition which prevents any formation/deposition of dielectric below the protective layer. Also, this material can be etched selectively with respect to the dielectric layer.

According to a particular embodiment, wherein removing the first protective layer comprises an etching step having a selectivity with respect to the first protective layer which is greater than a selectivity threshold of 10 (the first protective layer is etched at least 10 times faster than the dielectric layer), and/or removing the second protective layer comprises an etching step having a selectivity for the second protective layer which is greater than the selectivity threshold of 10 with respect to the second dielectric layer.

Hence, the material of the protective layers may be chosen so as to obtain the above-mentioned selectivity levels. The skilled person will be able to select suitable materials, for example silicon dioxide.

According to a particular embodiment, the etching step for the first and/or the second protective layer comprises using a bath of hydrofluoric acid or a buffered oxide etch.

According to a particular embodiment, the method further comprises: forming a third protective layer above the top electrode region of the second capacitor (and leaving the top electrode region of the first capacitor exposed); forming a third dielectric layer having the first thickness above the top electrode region of the first capacitor; forming a fourth protective layer above the third dielectric layer and above the top electrode region of the first capacitor (and leaving the top electrode region of the second capacitor exposed); removing the third protective layer to expose the top electrode region of the second capacitor; forming a fourth dielectric layer having the second thickness above the top electrode region of the second capacitor; removing the third protective layer; forming a supplementary top electrode region above the top electrode region of the first capacitor and above the third dielectric layer so as to form a third capacitor; and forming a supplementary top electrode region above the top electrode region of the second capacitor and above the fourth dielectric layer so as to form a fourth capacitor. These two top electrodes may be deposited during the same step.

Thus, the invention also applies to stacks of capacitor known as MIMIM. It should be noted that the above embodiment can also be performed a plurality of times, using the supplementary electrodes as the top electrodes of the previously made capacitors (for manufacturing MIMIMIM and more).

It should be noted that the stacked capacitors have the same dielectric thickness and will behave similarly when a voltage is applied.

According to a particular embodiment, the protective layers have a thickness in the range of twice the width of the blind holes or of the trenches surrounding the pillars (at plus or minus 20%).

Preferably, the thickness of the first protective layer (or of the second protective layer) is in the range of twice the width of the holes of the first or second bottom electrode regions (at plus or minus 20%). In fact, when this thickness is in the range of twice this width and because the deposition method used may be non-conformal, this allows forming a plug above the hole to prevent any material deposition on the surface of the covered bottom electrode region.

Alternatively, if pillars are used instead of holes, the thickness of the first protective layer or of the second protective layer may be in the range of twice the width of the trenches which surround a pillar (at plus or minus 20%).

The invention also provides an electronic product having a first capacitor and a second capacitor, the electronic product comprising: a semi-conductor substrate having a bottom electrode region of the first capacitor and a bottom electrode region of the second capacitor; a first dielectric layer having a first thickness arranged above the bottom electrode region of the first capacitor; a second dielectric layer having a second thickness arranged above the bottom electrode region of the second capacitor, the first thickness and the second thickness being different; a top electrode region of the first capacitor arranged above the bottom electrode of the first capacitor and above the first dielectric layer; and a top electrode region of the second capacitor arranged above the bottom electrode of the second capacitor and above the second dielectric layer. Again, these two top electrodes may be deposited during the same step.

According to a particular embodiment, the bottom electrode region of the first capacitor and/or the bottom electrode region of the second capacitor comprises at least one pillar or at least one blind hole or one trench in the semiconductor substrate.

According to a particular embodiment, the electronic product further comprises: a third dielectric layer having the first thickness arranged above the top electrode region of the first capacitor; a fourth dielectric layer having the second thickness arranged above the top electrode region of the second capacitor; a supplementary top electrode region arranged above the top electrode region of the first capacitor and above the third dielectric layer so as to form a third capacitor; and a supplementary top electrode region arranged above the top electrode region of the second capacitor and above the fourth dielectric layer so as to form a fourth capacitor. Again, these two top electrodes may be deposited during the same step.

It should be noted that the above defined electronic product may be produced using any particular embodiment of the method as defined above.

BRIEF DESCRIPTION OF THE DRAWINGS

Further features and advantages of the present invention will become apparent from the following description of certain embodiments thereof, given by way of illustration only, not limitation, with reference to the accompanying drawings in which.

DETAILED DESCRIPTION OF EXAMPLE EMBODIMENTS

The steps for fabricating this electronic product comprising two capacitors having different dielectric thicknesses according to an embodiment will be described hereinafter.

Figure 1A:
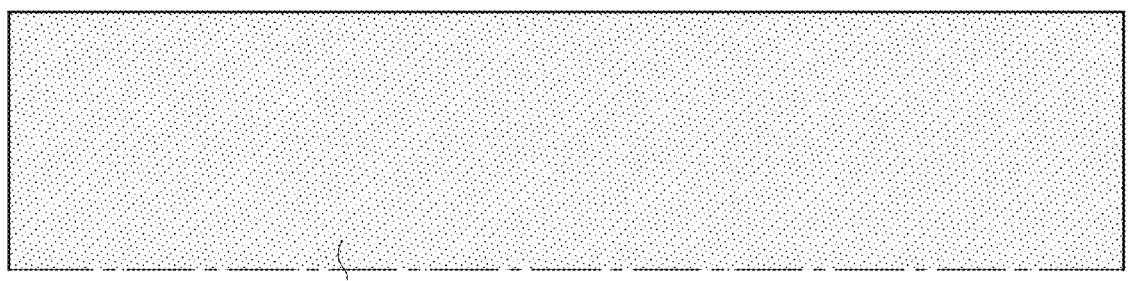
FIGS. 1A, 1B, 1C, 1D, 1E, 1F, 1G, 1H, 1I, 1J, 1K, 1L, 1M, 1N, 1O, and 1P represent the various steps of the fabrication of two capacitors according to an embodiment.

FIG. 1A is a side view of a semi-conductor substrate 100, and in this example the substrate is a silicon substrate. This substrate typically has a thickness of the order of several hundreds of micrometers.

Figure 1B:
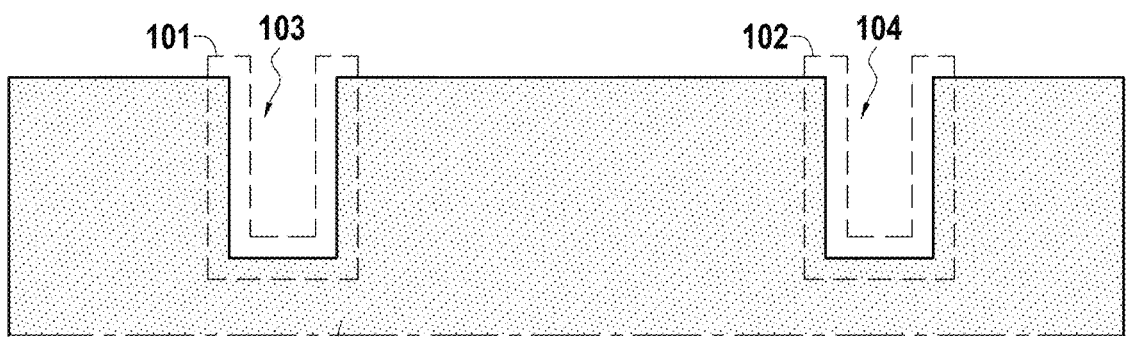

In order to form a capacitor, bottom electrodes are formed in the silicon substrate from the top surface (on the figure) of the substrate, as shown on FIG. 1B. On this figure a first bottom electrode 101 and a second bottom electrode 102. The manufacture of these electrodes comprises carrying out a DRIE step on the top of the surface of the substrate 100. This DRIE step forms, in this example, two holes 103 and 104 respectively associated with the first bottom electrode 101 and the second bottom electrode 103.

It should be noted that the invention is not limited to electrodes comprising holes. Various shapes of electrodes are compatible with the embodiments described in the present application. For example, the electrodes can comprise an array of pillar: the DRIE step therefore delimits the pillar by etching around these pillars.

In order to obtain conductive electrodes, a doping step may be performed before or after the formation of the holes 103 and 104 using a process which may be chosen by the person skilled in the art (doping through pre-deposition and diffusion for instance). Alternatively, a deposition of a conductive material in the hole or the trench (such as TiN) could also be carried out, still using a process which may be chosen by the person skilled in the art (Atomic Layer Deposition for instance).

Figure 1C:
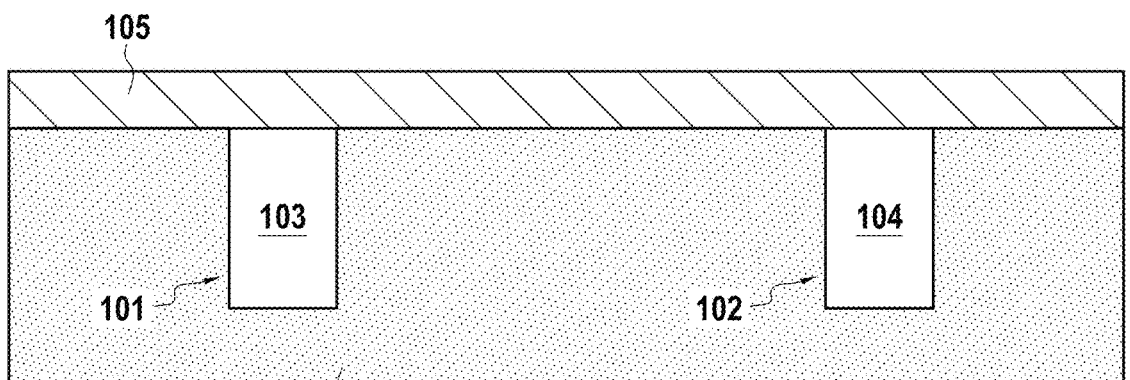

Once the electrodes are formed, a first protective layer 105 is formed by deposition above the entire top surface of the substrate 100, including above the first bottom electrode 101 and above the second bottom electrode 102 (FIG. 1C).

The first protective layer 105 comprises silicon dioxide (and may even comprise only silicon dioxide) deposited using a PECVD method. This PECVD is non conformal, as can be observed on the figure in which the holes 103 and 104 are not filled or partially filled with the protective layer.

Preferably, the thickness of the first protective layer 105 is at least twice the width of the holes 103 and 104 (it should be noted that for the sake of simplicity, this is not the case on the figures). In fact, when this thickness is at least twice the width of the holes 103 and 104, and because of the non-conformity of the deposition step, the holes 103 and 104 become inaccessible from the top of the substrate. In fact, a plug is formed at the opening of the holes because the material deposited around these openings ends up covering the hole. This plug shall prevent deposition of material directly above the electrodes which are beneath.

Alternatively, if pillars are used instead of holes, the thickness of the first protective layer may be at least twice the width of the trenches which surround a pillar.

Figure 1D:
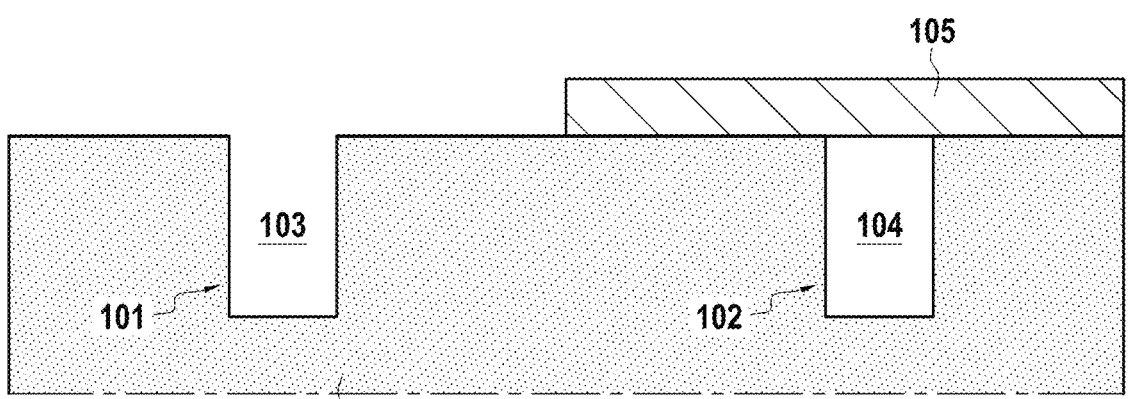

As shown on FIG. 1D, a photolithography step is carried out to define a pattern in the first protective layer 105. The protective layer is formed so as to be above the second bottom electrode 102. The first bottom electrode 101 is exposed after this step.

An etching step of the first protective layer may be performed using a bath of hydrofluoric acid or a buffered oxide etch to remove the silicon dioxide of the first protective layer without etching the silicon substrate.

Figure 1E:
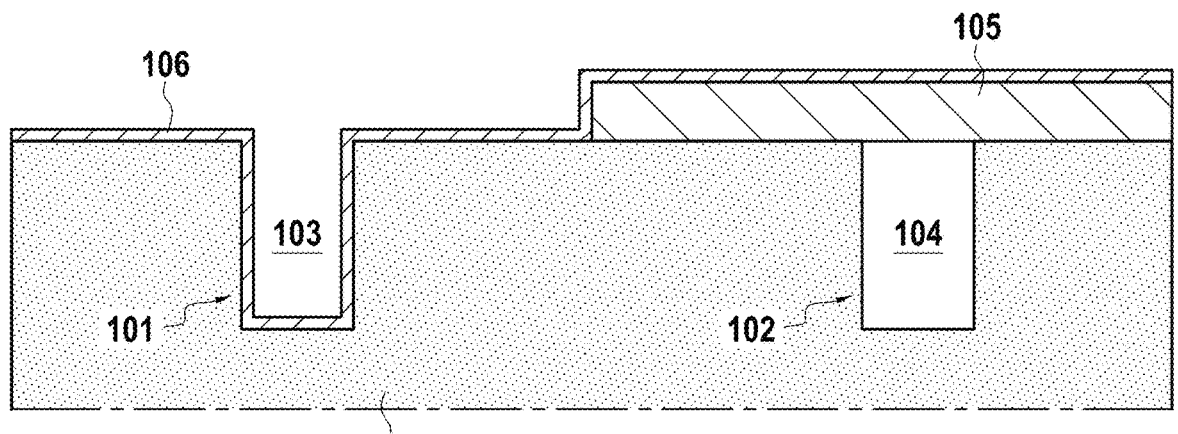

A first dielectric layer 106 is then formed, as shown on FIG. 1E. This first dielectric layer is formed above the first bottom electrode 101.

The first dielectric layer has a first thickness which may be chosen according to the final application of the capacitor. The first dielectric layer is deposited in a conformal manner, and it may contain any suitable dielectric material such as silicon nitride ($Si_3N_4$), aluminum oxide ($Al_2O_3$), hafnium oxide ($HfO_2$) etc. . . . . . As shown on the figure, the first dielectric layer has a uniform thickness on the entire surface of the first bottom electrode 101. The first dielectric layer 106 also does not come into contact with the surface of the second electrode 102, because of the first protective layer 105.

Figure 1F:
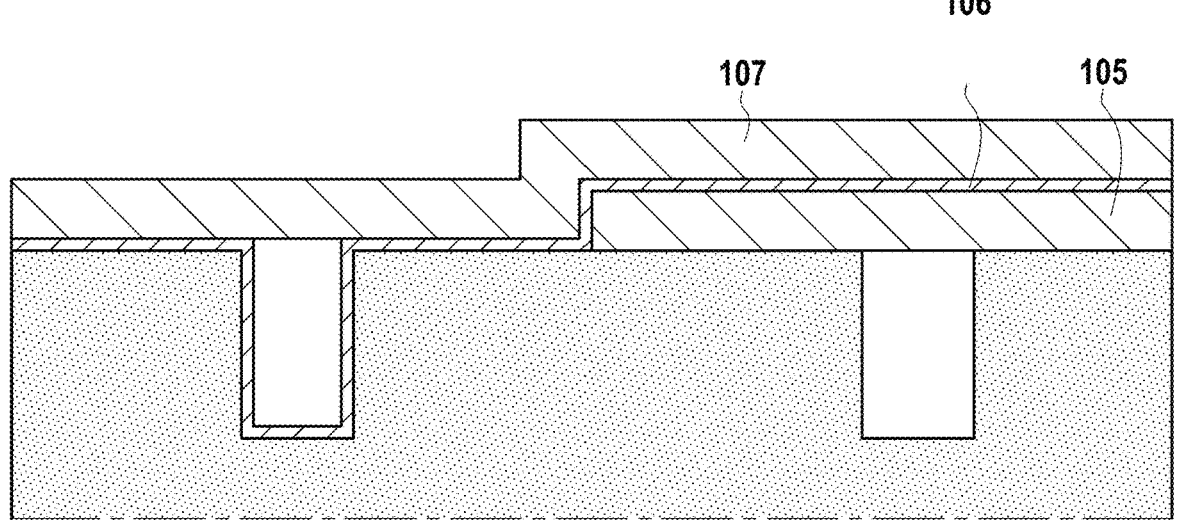

In order to pattern this first dielectric layer so that it only covers the first bottom electrode, a second protective layer 107 is deposited as shown on FIG. 1F. This second protective layer may contain silicon dioxide and it may have the same thickness as the first protective layer so as to cover the holes.

Figure 1G:
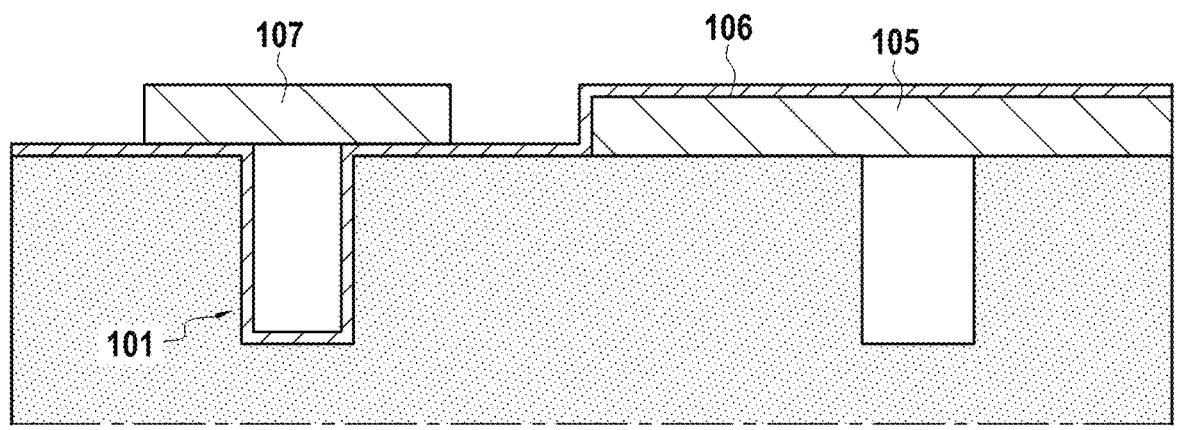

This second protective layer 107 is then patterned (FIG. 1G) during a photolithography step which is analogous to the one described in reference to FIG. 1D. The second protective layer 107 is at least above the first dielectric layer and above the first bottom electrode 101. It should be noted that the first dielectric layer withstands the etching bath used to etch the second protective layer 107. In other words, there is a high selectivity between the material of the second protective layer (silicon dioxide for instance) and the material used for the first dielectric layer (silicon nitride for instance).

Figure 1H:
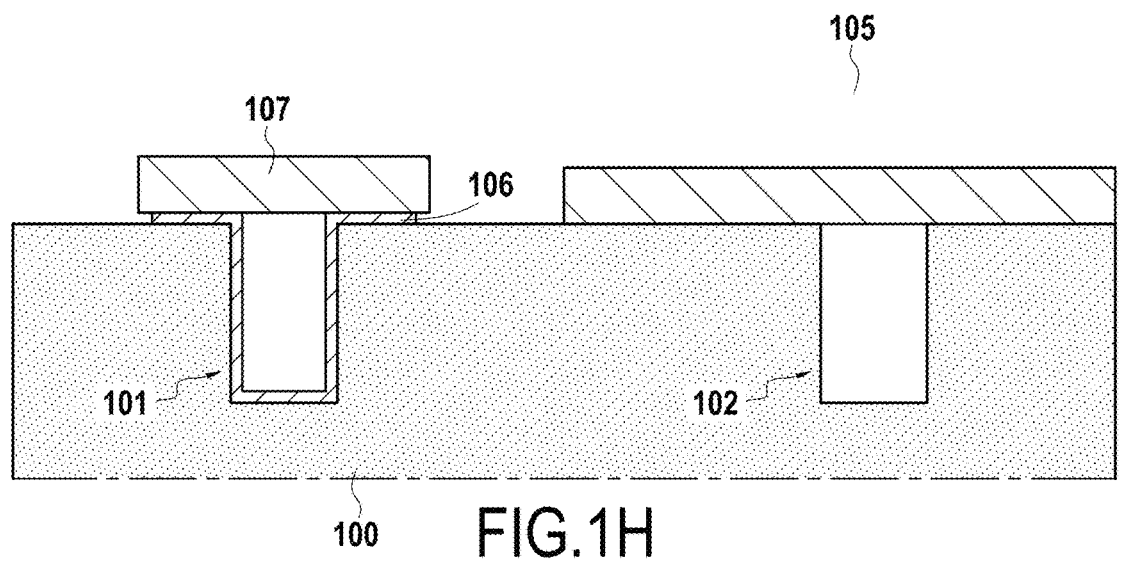

As shown on FIG. 1H, the first dielectric layer is patterned using the second protective layer 107. A wet etching step may be used which does not etch the material of the second protective layer 107 and of the silicon substrate. By way of example, it is possible to use phosphoric acid ($H_3PO_4$) to remove silicon nitride (if this material was chosen for the first dielectric layer).

Figure 1I:
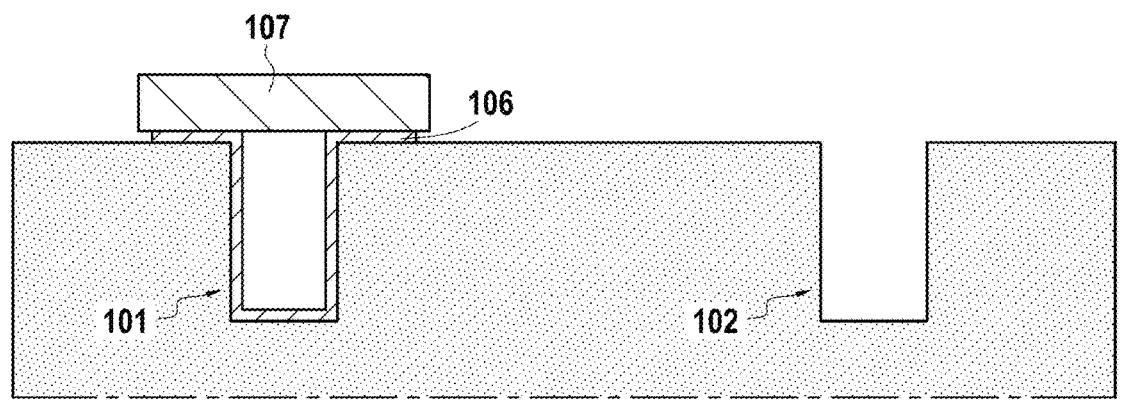

As shown on FIG. 1I, the first protective layer 105, which is not covered by the first dielectric layer 106, may be removed (a photolithography step may be carried out to protect the second protective layer). The second bottom electrode 102 is now exposed.

Figure 1J:
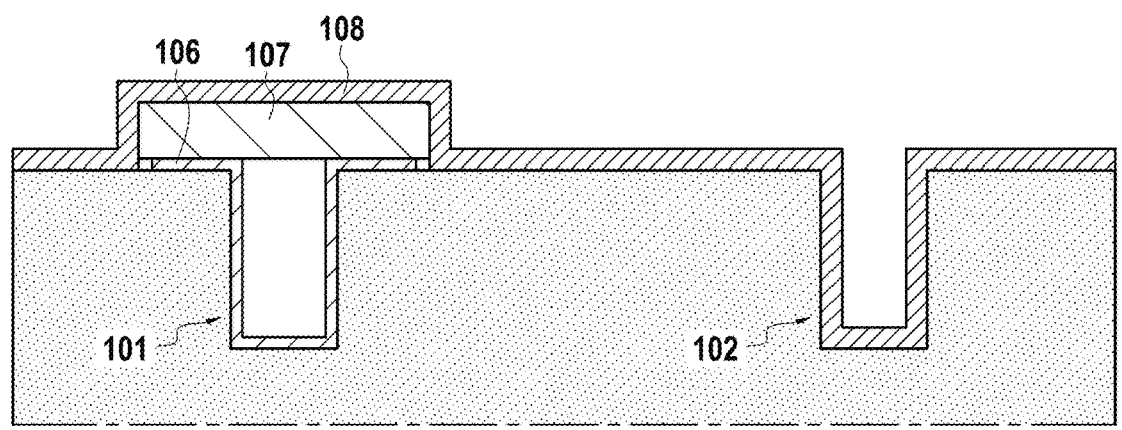

At this stage and as shown on FIG. 1J it is possible to form a second dielectric layer 108. This second dielectric layer is formed above the second bottom electrode 102.

The second dielectric layer has a second thickness which may be chosen according to the final application of the capacitor and which differs from the first thickness of the first dielectric layer. The second dielectric layer is deposited in a conformal manner, and it may contain any suitable dielectric material such as silicon nitride ($Si_3N_4$), aluminum oxide ($Al_2O_3$), hafnium oxide ($HfO_2$) etc. . . . . . As shown on the figure, the second dielectric layer has a uniform thickness on the entire surface of the second bottom electrode 102. The second dielectric layer 108 also does not come into contact with the surface of the first electrode 102, because of the second protective layer 107.

Figure 1K:
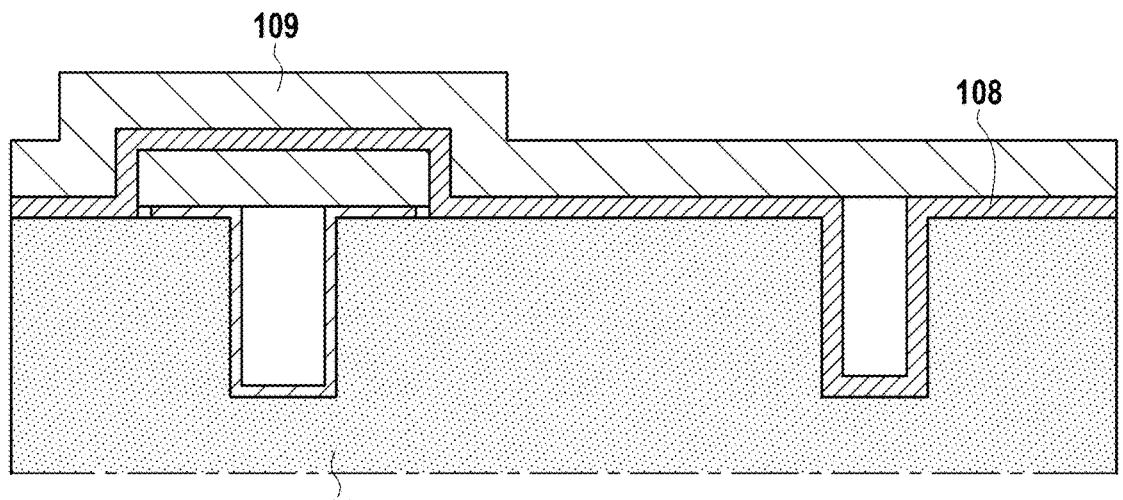

As shown on FIG. 1K, in order to pattern the second dielectric layer 108, an additional protective layer 109 is formed above the second dielectric layer 108. The additional protective layer 109 is analogous to the first and the second protective layer.

Figure 1L:
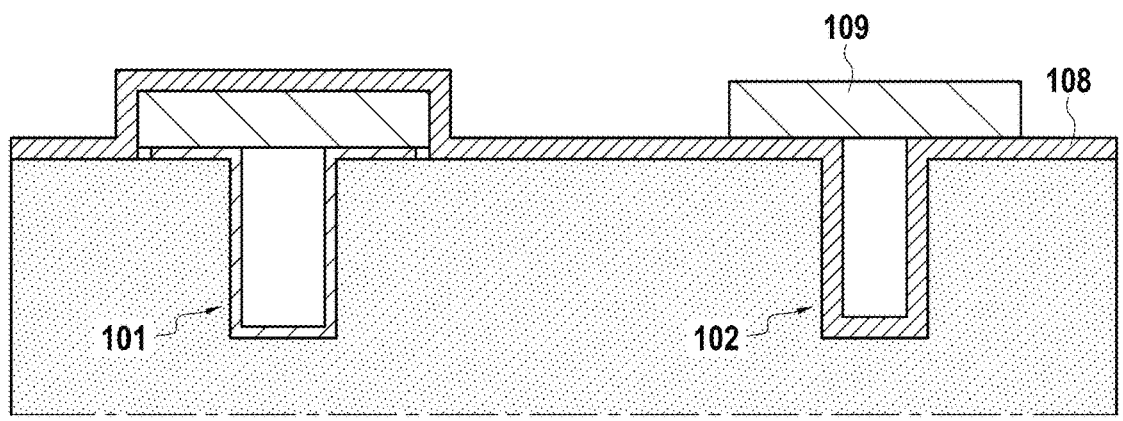

The additional protective layer 109 is patterned through a photolithography step, as shown on FIG. 1L so as to only be present above the second bottom electrode 102 and the second dielectric layer 108.

Figure 1M:
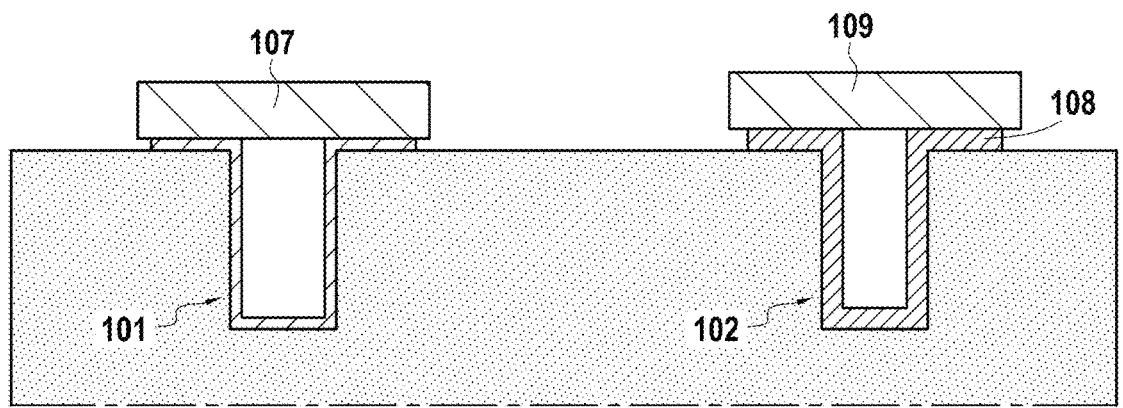

As shown on FIG. 1M, the second dielectric layer is patterned using the additional protective layer 109. A wet etching step may be used which does not etch the material of the additional protective layer 109 and of the silicon substrate. By way of example, it is possible to use phosphoric acid ($H_3PO_4$) to remove silicon nitride (if this material was chosen for the first dielectric layer).

Figure 1N:
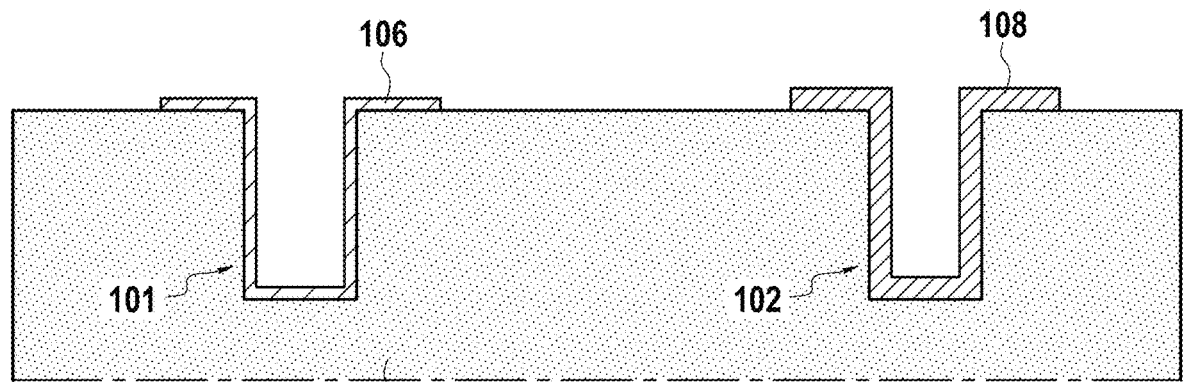

The remaining protective layer may be removed, as shown on FIG. 1N in which the second protective layer is removed and the additional protective layer 109 is removed, so as to leave the first dielectric layer 106 arranged only above the first bottom electrode region 101 exposed and the second dielectric layer 108 arranged only above the second bottom electrode region 102 exposed.

Preferentially, an oxidation step is carried out to form a stack 110 known to the person skilled in the art as ONO (Oxide Nitride Oxide) is formed above the two dielectric layers (FIG. 1O) if silicon nitride is used in the dielectric stack. Additionally, the surface of the silicon substrate 100 which remains exposed may oxidize, thus minimizing leakage between bottom electrodes through surface current from one capacitor to the other.

Figure 1O:
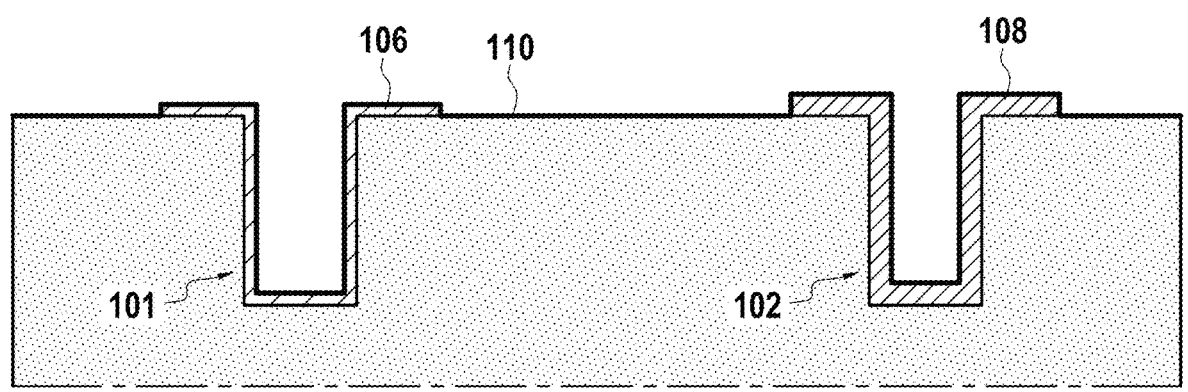
Figure 1P:
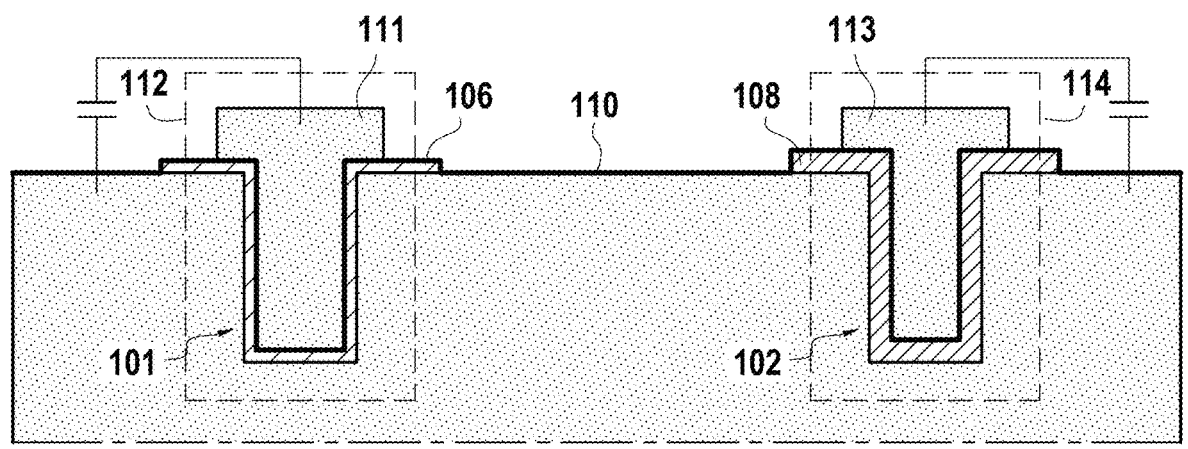

Then, as shown on FIG. 1P, a first top electrode region 111 is formed above the first dielectric layer 106 and above the first bottom electrode region 101 so as to form a first capacitor 112. This capacitor 112 is also shown schematically using the capacitor symbol. This capacitor has a capacity which is a function of the thickness of the first dielectric layer 106. The breakdown voltage of this capacitor is also a function of this thickness.

A second top electrode region 113 is formed above the second dielectric layer 108 and above the second bottom electrode region 102 so as to form a second capacitor 114. This capacitor 114 is also shown schematically using the capacitor symbol. This capacitor has a capacity which is a function of the thickness of the second dielectric layer 108. The breakdown voltage of this capacitor is also a function of this thickness.

It should be noted that the top electrode regions 111 and 113 completely fill the holes or the trenches initially formed. These top electrodes may contain polysilicon, or doped polysilicon. The top electrodes 111 and 113 may be made of the same layer in order to minimize the amount of process steps.

An alternative embodiment is shown on FIGS. 2A to 2L. In this embodiment, stacked capacitors are formed.

The first steps of this embodiment are similar to the steps described above in reference to FIGS. 1A to 1O.

Figure 2A:
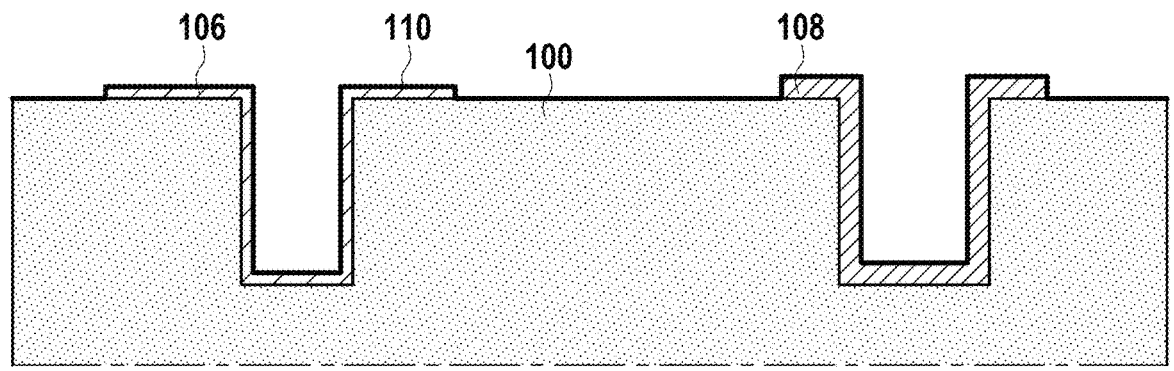
FIGS. 2A, 2B, 2C, 2D, 2E, 2F, 2G, 2H, 2I, 2J, 2K, 2L represent the various steps of the fabrication of supplementary electrodes to produces stacked capacitors, according to an embodiment.
Figure 2B:
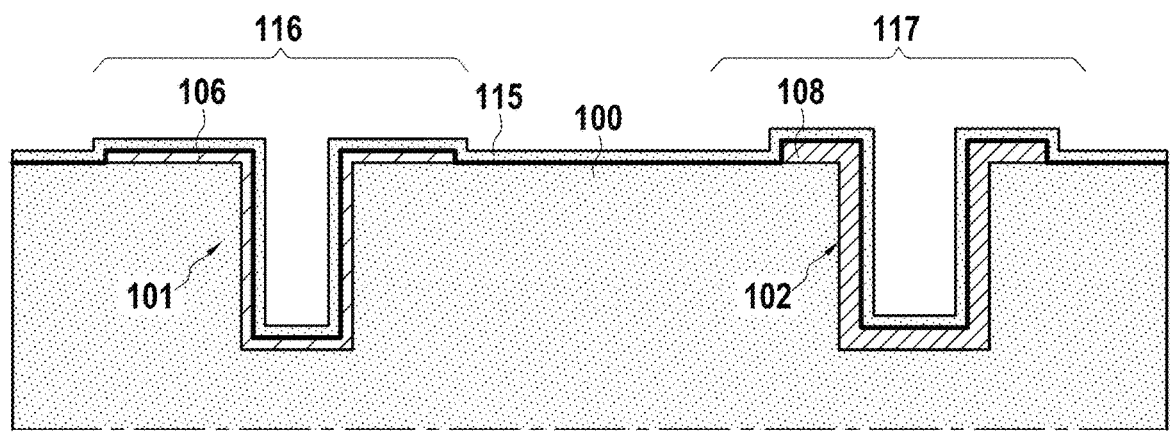

Thus, FIG. 2A is similar to FIG. 1O and the same elements bear the same references on all the figures.

In order to form the stacked capacitors, or MIMIM capacitors, a top electrode layer 115 is formed in a deposition step. This top electrode layer 115 comprises polysilicon, and its thickness may be less than the width of the holes.

Figure 2C:
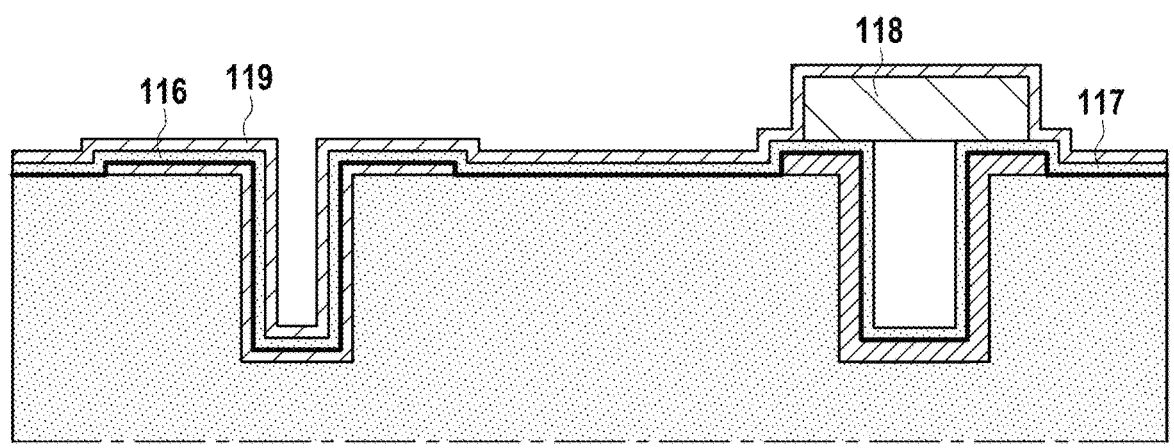

The top electrode layer comprises two top electrode regions:

A first top electrode region 116 is above the first dielectric layer 106 and above the first bottom electrode region so as to form a first capacitor, A second top electrode region 117 is above the second dielectric layer 108 and above the second bottom region so as to form a second capacitor, As shown on FIG. 2C, a third protective layer 118 may be formed above the second top electrode region 117 while leaving the first top electrode region 116 exposed (the third protective layer is analogous to the first and second protective layer and it may be patterned similarly).

A third dielectric layer 119 is then deposited above the first top electrode region 116, which is exposed and not covered by the third protective layer 118. In this example, the third dielectric layer 119 has the thickness of the first dielectric layer of the first capacitor.

Figure 2D:
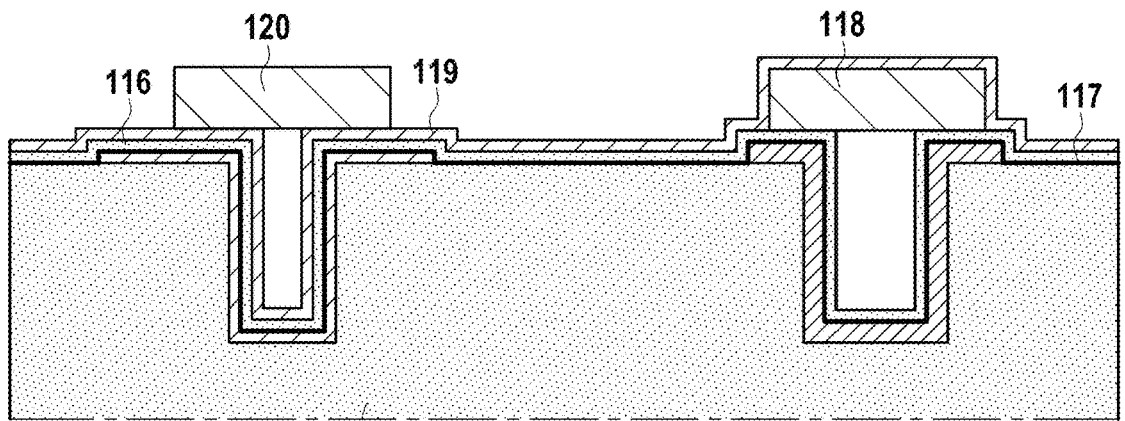

In order to pattern the third dielectric layer 119, a fourth protective layer 120 (analogous to the first, second, and third protective layers) is formed above the first top electrode region 116 (FIG. 2D).

Figure 2E:
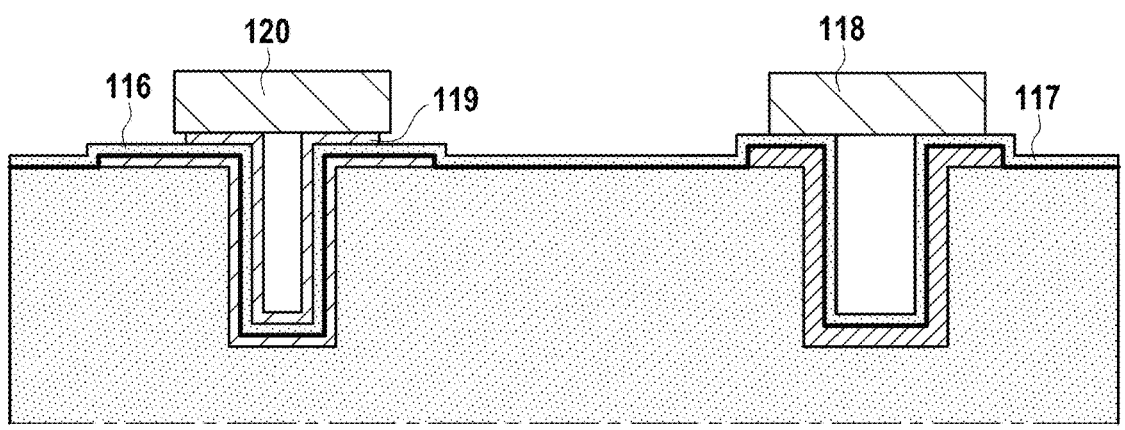
Figure 2F:
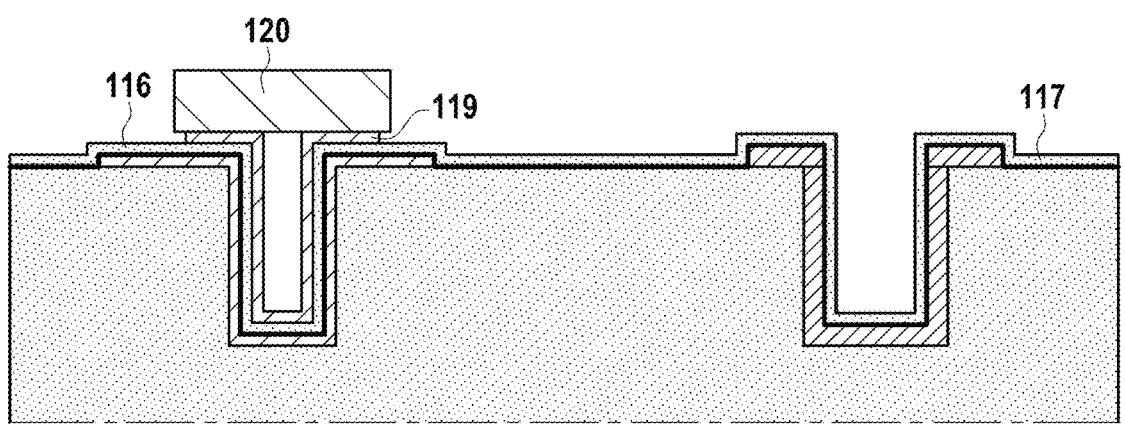

The third dielectric layer 119 is then patterned through an etching step (FIG. 2E).

The third protective layer 118 is removed (FIG. 2F) so as to leave the second top electrode region 117 exposed. The remaining portion of the third dielectric layer, under the fourth protective layer 120, remains above the top electrode region 116.

Figure 2G:
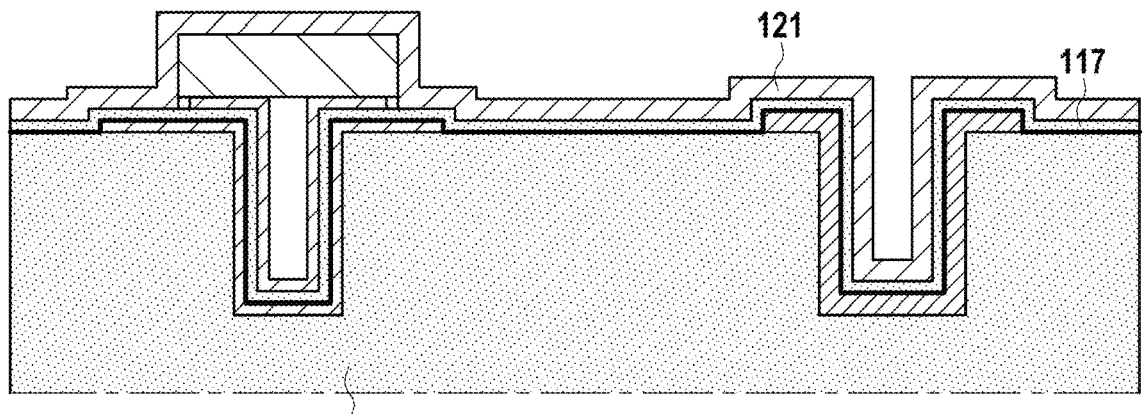
Figure 2H:
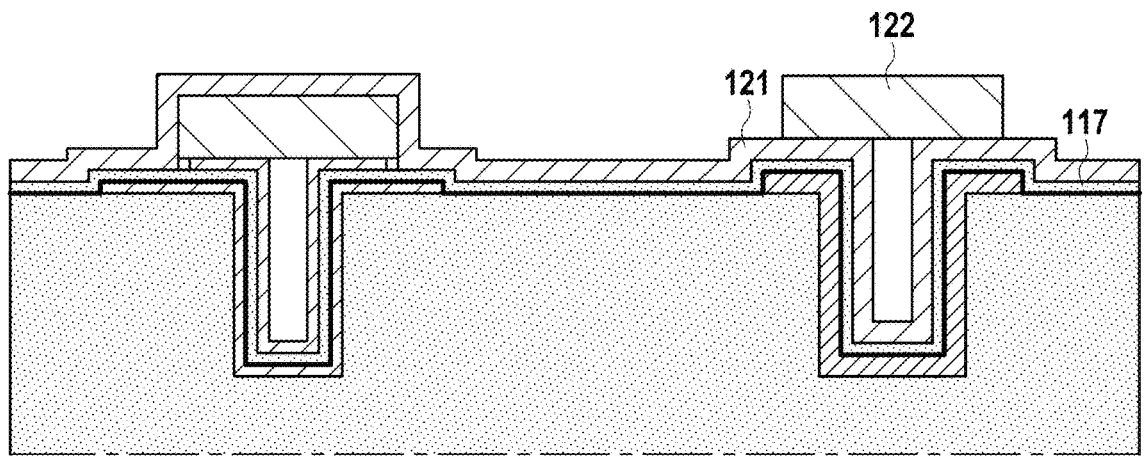

A fourth dielectric layer 121 is deposited above the second top electrode region 117, as shown on FIG. 2G. This fourth dielectric layer has the thickness of the first dielectric layer of the second capacitor.

In order to pattern the fourth dielectric layer 121, a second additional protective layer 122 is deposited and patterned (FIG. 2H) so as to be above the second top electrode region 117.

Figure 2I:
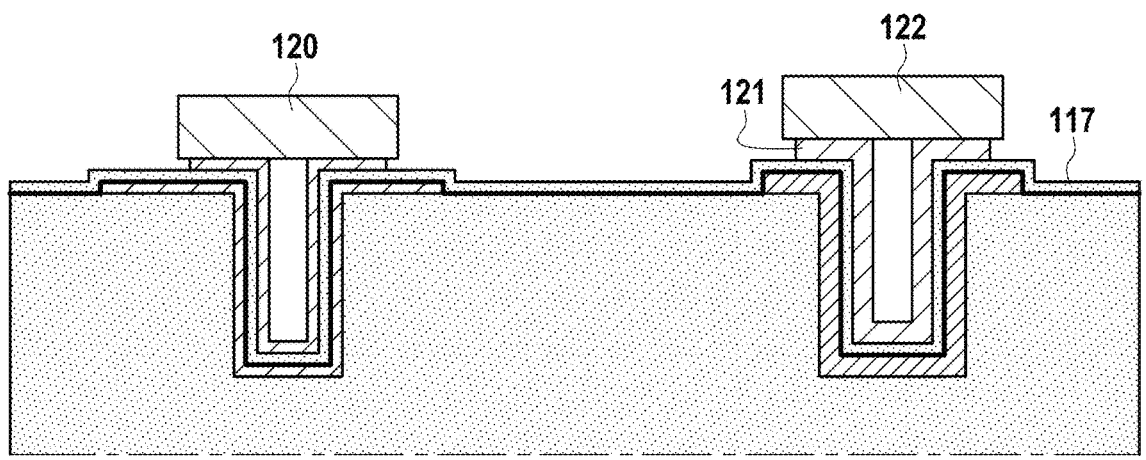

The fourth dielectric layer 121 is patterned by etching the exposed areas, as shown on FIG. 2I in which only portions of the fourth protective layer 120 and portions of the second additional protective layer remain.

Figure 2J:
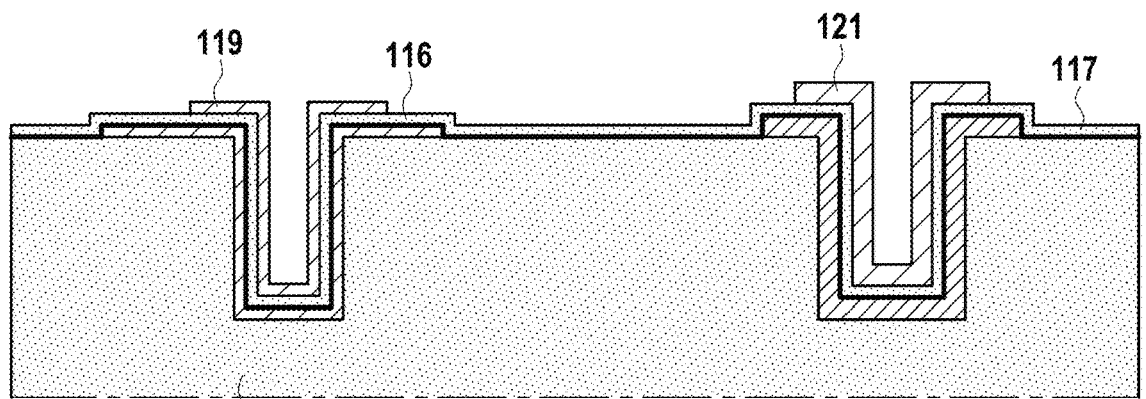
Figure 2K:
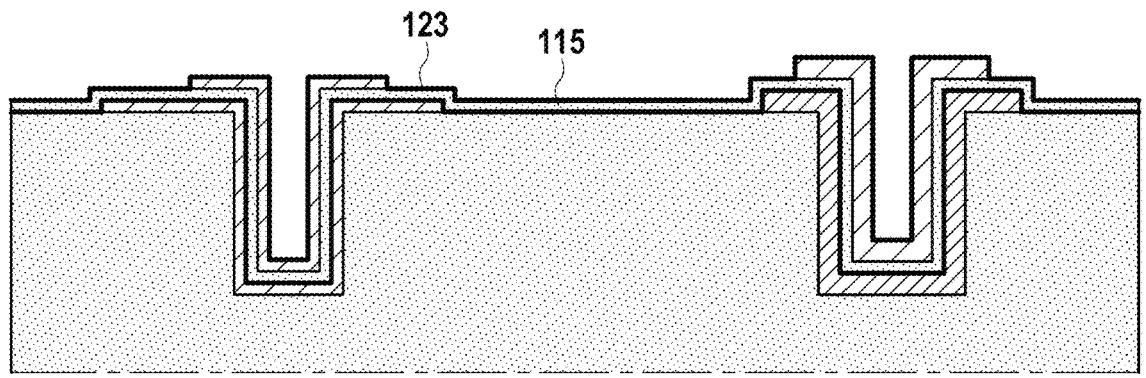

Then, as shown on FIG. 2J, the portions of the fourth protective layer 120 and the portions of the second additional protective layer which remain are removed by etching.

At this stage, the third dielectric layer 119 arranged only above the first top electrode region 116 exposed and the fourth dielectric layer 121 arranged only above the second top electrode region 117 exposed.

Preferentially, an oxidation step is carried out to form a stack 123 known to the person skilled in the art as ONO (Oxide Nitride Oxide) is formed above the two dielectric layers (FIG. 2K) if silicon nitride is used in the dielectric stack. Additionally, the surface of the top electrode 115 which remains exposed may oxidize.

Figure 2L:
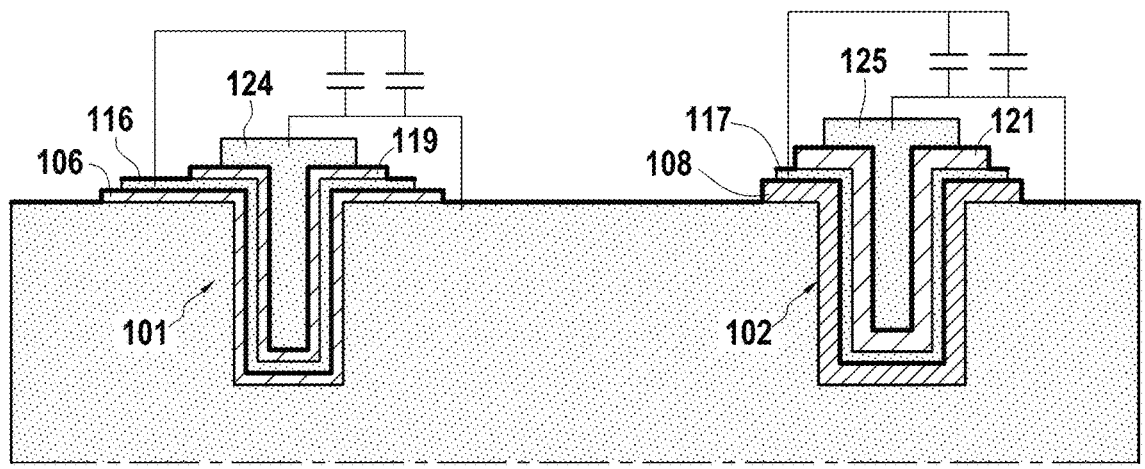

Then, as shown on FIG. 2L, a first supplementary top electrode region 124 is formed above the third dielectric layer 119 and above the first top electrode region 116 so as to form a third capacitor. This third capacitor can be connected in parallel with the capacitor formed by the first bottom electrode region 101, the first dielectric layer 106, and the first top electrode region 116. The two capacitors share an electrode: the first top electrode region 116. By interconnecting the first supplementary top electrode region with the first bottom electrode region 101, the two capacitors are connected in parallel, as shown using the symbols for capacitors on the figure.

A second supplementary top electrode region 125 is formed above the fourth dielectric layer 121 and above the second top electrode region 117 so as to form a fourth capacitor. This fourth capacitor can be connected in parallel with the capacitor formed by the second bottom electrode region 102, the second dielectric layer 108, and the second top electrode region 117. The two capacitors share an electrode: the second top electrode region 117. By interconnecting the second supplementary top electrode region with the second bottom electrode region 102, the two capacitors are connected in parallel, as shown using the symbols for capacitors on the figure.

It should be noted that in the above examples, the protective layers may comprise the same materials, may have the same thickness, and may be patterned similarly.

The above examples allow forming, on a same substrate, capacitors having different dielectric thicknesses and consequently different breakdown voltage. Thus, if it is required that a portion of the capacitors on a chip be able to withstand different voltages, it is not required to use the same large thickness for all the capacitors because this leads to increasing the surface area of the capacitors (in order to keep the same capacitance value).

Also, it should be noted that the capacitors obtained using the methods as described above are formed in a same semiconductor substrate and may, in fine, be placed on a same chip and in a same package.

ADDITIONAL VARIANTS

Although the present invention has been described above with reference to certain specific embodiments, it will be understood that the invention is not limited by the particularities of the specific embodiments. Numerous variations, modifications and developments may be made in the above-described embodiments within the scope of the appended claims.

The invention claimed is:

1. A method of forming a first capacitor and a second capacitor, the method comprising:
    forming, in a semi-conductor substrate, a bottom electrode region of the first capacitor and a bottom electrode region of the second capacitor;
    forming a first protective layer above the bottom electrode region of the second capacitor;
    forming a first dielectric layer having a first thickness above the bottom electrode region of the first capacitor;
    forming a second protective layer above the first dielectric layer and above the bottom electrode region of the first capacitor;
    removing the first protective layer to expose the bottom electrode region of the second capacitor;
    forming a second dielectric layer having a second thickness above the second electrode region of the second capacitor, the first thickness and the second thickness being different;
    removing the second protective layer;
    forming a top electrode region of the first capacitor above the bottom electrode of the first capacitor and above the first dielectric layer so as to form the first capacitor; and
    forming a top electrode region of the second capacitor above the bottom electrode of the second capacitor and above the second dielectric layer so as to form the second capacitor,
    wherein the forming, in a semi-conductor substrate, of the bottom electrode region of the first capacitor and/or the bottom electrode region of the second capacitor comprises forming at least one pillar or at least one blind hole in the semiconductor substrate, and
    wherein the first and second protective layers have a thickness in a range of twice a width of the blind holes or of the trenches surrounding the pillars.

2. The method according to claim 1, wherein the forming, in a semi-conductor substrate, of the bottom electrode region of the first capacitor or the bottom electrode region of the second capacitor comprises a deep reactive ion etching step.

3. The method according to claim 1, wherein the forming of the first protective layer or the forming of the second protective layer comprises a non-conformal deposition step.

4. The method according to claim 3, wherein the protective layer comprises silicon dioxide.

5. The method according to claim 1, wherein the removing of the first protective layer comprises an etching step having a selectivity with respect to the first protective layer which is greater than a selectivity threshold of 10 such that the first protective layer is etched at least 10 times faster than the dielectric layer, and/or
    the removing of the second protective layer comprises an etching step having a selectivity for the second protective layer which is greater than the selectivity threshold of 10 with respect to the second dielectric layer.

6. The method according to claim 5, wherein the etching step for the first and/or the second protective layer comprises using a bath of hydrofluoric acid or a buffered oxide etch.

7. The method according to claim 1, further comprising forming a third protective layer above the top electrode region of the second capacitor;
    forming a third dielectric layer having the first thickness above the top electrode region of the first capacitor;

forming a fourth protective layer above the third dielectric layer and above the top electrode region of the first capacitor;

removing the third protective layer to expose the top electrode region of the second capacitor;

forming a fourth dielectric layer having the second thickness above the top electrode region of the second capacitor;

removing the third protective layer;

forming a first supplementary top electrode region above the top electrode region of the first capacitor and above the third dielectric layer so as to form a third capacitor; and forming a second supplementary top electrode region above the top electrode region of the second capacitor and above the fourth dielectric layer so as to form a fourth capacitor.

* * * * *